United States Patent [19]

Mizuno

[11] Patent Number: 5,844,877
[45] Date of Patent: Dec. 1, 1998

[54] OPTICAL DEVICE

[75] Inventor: Takeshi Mizuno, Kanagawa, Japan

[73] Assignee: Sony Corporation, Tokyo, Japan

[21] Appl. No.: 910,279

[22] Filed: Aug. 13, 1997

[30] Foreign Application Priority Data

Aug. 19, 1996 [JP] Japan ..................................... 8-217556

[51] Int. Cl.$^6$ .............................. G11B 7/00; H01L 31/00
[52] U.S. Cl. ..................... 369/112; 369/44.14; 369/44.32
[58] Field of Search ................................. 369/44.14, 112, 369/54, 44.32

[56] References Cited

U.S. PATENT DOCUMENTS 5,703,863  12/1997  Doi ........................................ 369/112

Primary Examiner—Tod R. Swann
Assistant Examiner—Kim-Kwok Chu
Attorney, Agent, or Firm—Limbach & Limbach L.L.P.

[57] ABSTRACT

There is provided an optical device which comprises a light-emitting portion for emitting a laser light, a light-receiving portion for receiving the light emitted from the light-emitting portion, and a converging portion for converging the light emitted from the light-emitting portion to thereby irradiate a portion to be irradiated and for converging a light reflected on and returned from the irradiated portion, wherein the light-receiving portion is located in the vicinity of a confocal point of the converging portion with respect to the light returned from the irradiated portion, the light emitted from the light-emitting portion is received by the light-receiving portion along a path which is coaxial before and after being reflected by the irradiated portion, a push-pull signal is detected by the light-receiving portion, and the push-pull signal is subjected to partial differentiation with the amount of defocus to obtain a coefficient which is used to detect a tracking error signal.

6 Claims, 9 Drawing Sheets

Groove or Pit

OPTICAL DEVICE

BACKGROUND OF THE INVENTION

The present invention relates to an optical device preferably used for, for example, irradiating a portion to be irradiated which is an optical recording medium such as an optical disc, a magneto-optical disc or the like with a light from a light-emitting portion and for receiving and detecting a light reflected and returned from the irradiated portion.

A conventional optical device, e.g., an optical pick-up for an optical disc drive and a magneto-optical disc drive of a compact disc (CD) player or the like has a complicated and large overall structure because each of optical components such as a grating, a beam splitter and so on is assembled separately. Further, such device has required strict alignment accuracy in setting optical arrangement when such components are assembled on a substrate on a hybrid basis.

FIG. 1 illustrates an example of the configuration of a conventional optical pick-up 81 exclusively used for reproducing a compact disc (CD). This optical pick-up 81 comprises a semiconductor laser 82, a diffraction grating 83, a beam splitter plate 84, an objective lens 85 and a light-receiving element 86 constituted by a photodiode and so on. A laser light L from the semiconductor laser 82 is reflected on the beam splitter plate 84, converged by the objective lens 85 and irradiated on to an optical disk 90, and a return light reflected by the optical disc 90 passes through the beam splitter plate 84 to be received and detected by the light-receiving element 86.

However, such an optical pick-up 81 requires not only a great number of parts and a very large configuration but also high accuracy in arrangement thereof thereby being resulted in low productivity.

Normally, a push-pull method, a three-beam method, a heterodyne method and the like have been used for detecting a tracking error in the optical pick-up as described above and the like.

The above conventional push-pull method conventionally used is based on a fact that when a light spot formed by the light incident is deviated from a track or pit, a difference in light intensity is produced between positive and negative first-order diffracted light generated by a disk which in turn results in asymmetric far field patterns. For example, two detectors are used to obtain signals that reflects such asymmetry, and these signals are operated by means of a computing element to detect the deviation of the light spot (see FIGS. 2A and 2B).

FIGS. 2A and 2B show a schematic configuration of a tracking servo utilizing the push-pull method.

As shown in FIG. 2B, when irregularities formed by a pit on the surface of a disc 52 are irradiated by a light, the light is diffracted by the irregularities to be split into a zero-order diffracted light (primary beam B) and positive and negative first-order diffracted lights (secondary beams B').

$S_0$ and $S_1$ in FIG. 2B designate spots of irradiation by the zero-order diffracted light and the positive and negative diffracted lights, respectively. $S_0$ is circular because of the aperture of the objective lens.

In this case, as shown in FIG. 2A, two separated photodiodes $PD_R$ and $PD_L$ are arranged as a light-receiving portion in a far field region. Signals received by those photodiodes $PD_R$ and $PD_L$ are subjected to an operation, e.g., $(PD_L-PD_R)$, by a differential amplifier or the like (which is not shown) to obtain a tracking error signal TE as a tracking signal.

If there is a deviation between the track and the beam, the center of the spot deviates from the separating line of the two photodiodes. As a result, $TE=(PD_L-PD_R)$ does not equal 0 and results in a positive or negative value which depends on the direction of the deviation. It is thus possible to detect the direction and amount of the deviation from the track.

Although the tracking servo utilizing the push-pull method can be configured at a low cost because it can be achieved with only two separated photodiodes, the light returned from the disc shifts perpendicularly to the separating line of the light-receiving elements on the light-receiving surface in response to a shift of the lens, resulting in a problem in that a great offset occurs in the resultant signal.

A lateral shift of a lens 51 as shown in FIG. 3A results in corresponding shifts of the spots of the lights received by the photodiodes $PD_L$ and $PD_R$ as indicated by the dotted lines. Then, the tracking error signal TE does not equal 0 even if the tracking is properly done.

Further, an inclination of the lens 51 relative to the disc 52 as shown in FIG. 3B results in shifts in the spots of the received lights as indicated by the dotted lines. Again, the tracking error signal TE does not equal 0 even if the tracking is properly done.

Another method for detecting a tracking error is the three beam method as mentioned above. According to the three beam method, a light is split by a diffraction grating to form a primary beam and two secondary beams on both sides thereof; a groove or pit on the disc 52 is irradiated by a spot $S_0$ of the primary beam and spots $S_1$ and $S_2$ of the secondary beams on both sides thereof; and the tracking servo is achieved by detecting the reflections of each of the two secondary beams and by obtaining a difference signal therebetween.

If the primary beam spot $S_0$ deviates from the center of the track, the reflected beams resulting from the secondary beam spots $S_1$ and $S_2$ are not symmetric, which results in a fluctuation of a tracking error signal due to a difference signal from 0. Tracking servo can be achieved because the amount of the fluctuation of the tracking error signal varies depending on the amount of the deviation of the primary beam spot $S_0$ from the center of the track.

The reflected light resulting from the primary beam is used for detecting a signal recorded on the disc.

Although this approach can solve the problem of a lens shift as described above, since a primary beam must pass through a grating such as a diffraction grating or the like, problems arise in that a number of parts are involved; a reduction occurs in the amount of light of the primary beam and complicated adjustment is required, which is accompanied by an increase in the manufacturing cost.

Other methods for tracking servo include, for example, the heterodyne method in which four separate photodiodes ($PD_1$ through $PD_4$) separated in vertical and horizontal directions about an optical axis are used to detect reflected lights and in which the sum of signals detected at those photodiodes ($PD_1+PD_2+PD_3+PD_4$) and signals obtained by operating those detection signals (e.g., $PD_1+PD_3-PD_2-PD_4$) are detected on a heterodyne basis taking their phases into consideration or the like.

Although this method is advantageous in preventing the occurrence of an offset in a tracking error signal due to a lens shift, there is a problem in that complicated signal processing is involved.

As an improvement for solving the problems with the above-described optical device, a so-called CLC (confocal laser coupler) configuration has been conceived which allows a reduction in the number of optical parts and easier alignment in setting an optical arrangement and in which a light-emitting portion is disposed in a confocal point of converging means such as lenses or the like and a light-receiving portion is formed in the vicinity of the confocal point where the light-emitting portion is disposed in order to simplify the device as a whole and to make the same more compact.

The present applicant has proposed in U.S. patent application Ser. No. 08/603,872 an optical device in which separated photodiodes that constitute light-receiving portions are disposed in the confocal point as described above in order to eliminate any offset in a tracking error signal originating from a lens shift or an inclination of a disc as described above and in which the tracking servo is achieved using such separated photodiodes according to the push-pull method and so on.

According to such an optical device, since a tracking error signal is detected using the push-pull method performed at the light-receiving portions in the vicinity of the confocal point (CPP method: confocal push-pull method), a tracking error signal can be reliability detected even in the case of a lens offset or a warp of the disc, and the alignment during assembly is greatly simplified. Further, since the light-emitting and light-receiving portions are formed on the same substrate, it is possible to reduce the number of parts, to achieve a reduction in manufacturing cost, and to achieve high reliability.

However, the CPP method as described above has a problem specific to a confocal optical system as described below. The problem becomes most significant when focusing is not properly achieved and defocusing occurs instead.

FIG. 5 shows an example of such a situation. FIG. 5 is an example of the result of computation of values indicative of the relationship between a tracking error signal and the mount of detrack performed according to the CPP method in a case wherein defocusing occurs. The computation was carried out based on the assumption that the disc had a groove pitch of 1.60 $\mu$m; the depth of the groove was one-eighth of the wavelength and the disc had a duty (the ratio of the groove) of 65%. The wavelength was assumed to be 0.78 $\mu$m.

It is apparent from FIG. 5 that an error is caused in tracking error detection using the CPP method when there is a very slight defocus of, for example, ±1 $\mu$m or less which is within the focal depth. The defocus in this case refers to a geometric defocus.

Further, as can be seen from the defocus indicated by a curve G in FIG. 5 which equals −0.50 $\mu$m, there may be a signal having a frequency different from that of an inherent tracking error signal (the case where the defocus =0.00 $\mu$m as indicated by a curve E) or a tracking error signal having a frequency which is, for example, twice that of the inherent tracking error signal. There may be signals having inverted polarities as indicated by curves H and I.

Meanwhile, in an optical system for an optical disc, not only tracking control but also focus control must be performed during recording and reproduction of a signal. Focus control normally involves suppression of the amount of defocus to a value equal to or less than the focal depth of the objective lens utilizing methods such as the spot size method, astigmatic aberration method, knife edge method and so on. However, the amount of defocus is not always suppressed to 0 $\mu$m and, therefore, a method of correction or detection which takes the effect of defocus into consideration must be employed to detect a tracking error using the CPP method.

SUMMARY OF THE INVENTION

The present invention has been made taking the above-described points into consideration, and it is an object of the present invention to provide an optical device such as an optical pick-up or the like which has such a feature of a CLC configuration in which the number of optical parts can be reduced and alignment in setting optical arrangement can be simplified for a simplified and compact configuration of the device as a whole, capable of obtaining tracking signals such as a tracking error signal or the like stably, and easily manufactured using a semiconductor process.

According to the present invention, there is provided an optical device characterized in that:

it comprises a light-emitting portion, a converging means and a light-receiving portion, wherein the converging means converges the light emitted by the light-emitting portion, irradiates the same on a portion to be irradiated and converges a light reflected by and returned from the irradiated portion;

the light-receiving portion is located in the vicinity of a confocal point of the converging means with respect to the light returned from the irradiated portion;

the light emitted by the light-emitting portion is received by the light-receiving portion along a path which is coaxial before and after being reflected by the irradiated portion;

a push-pull signal is detected by the light-receiving portion; and the signal is subjected to partial differentiation with the amount of defocus to obtain a coefficient which is used to detect a tracking error signal.

With the above-described configuration of the present invention, the light emitted by the light-emitting portion is converged by the converging means and then irradiated onto the portion to be irradiated; the light reflected by and returned from the irradiated portion is converged; and the light-receiving portion is located in the vicinity of a confocal point of the converging means with respect to the light returned from the irradiated portion. Thus, the light emitted by the light-emitting portion is received by the light-receiving portion along a path which is coaxial before and after being reflected by the irradiated portion. At that time, by detecting a push-pull signal at the light-receiving portion, it is possible to detect an irradiation position of the incident light, namely, the light emitted by the light-emitting portion on the irradiated portion. By detecting a tracking error signal using a coefficient obtained by performing partial differentiation on a signal obtained from this push-pull detection, variation in the tracking error signal caused by defocus can be suppressed.

DETAILED DESCRIPTION OF THE PREFERRED EMBODIMENT

An optical device according to the present invention has an optical configuration similar to that in accordance with the above-described CPP method (confocal push-pull method) and a novel method for signal processing is applied to the same device to overcome a disadvantage of the CPP method, thereby allowing stable detection of a tracking error signal.

A preferred embodiment of the optical device according to the present invention will now be described with reference to the accompanying drawings.

Figure 6:
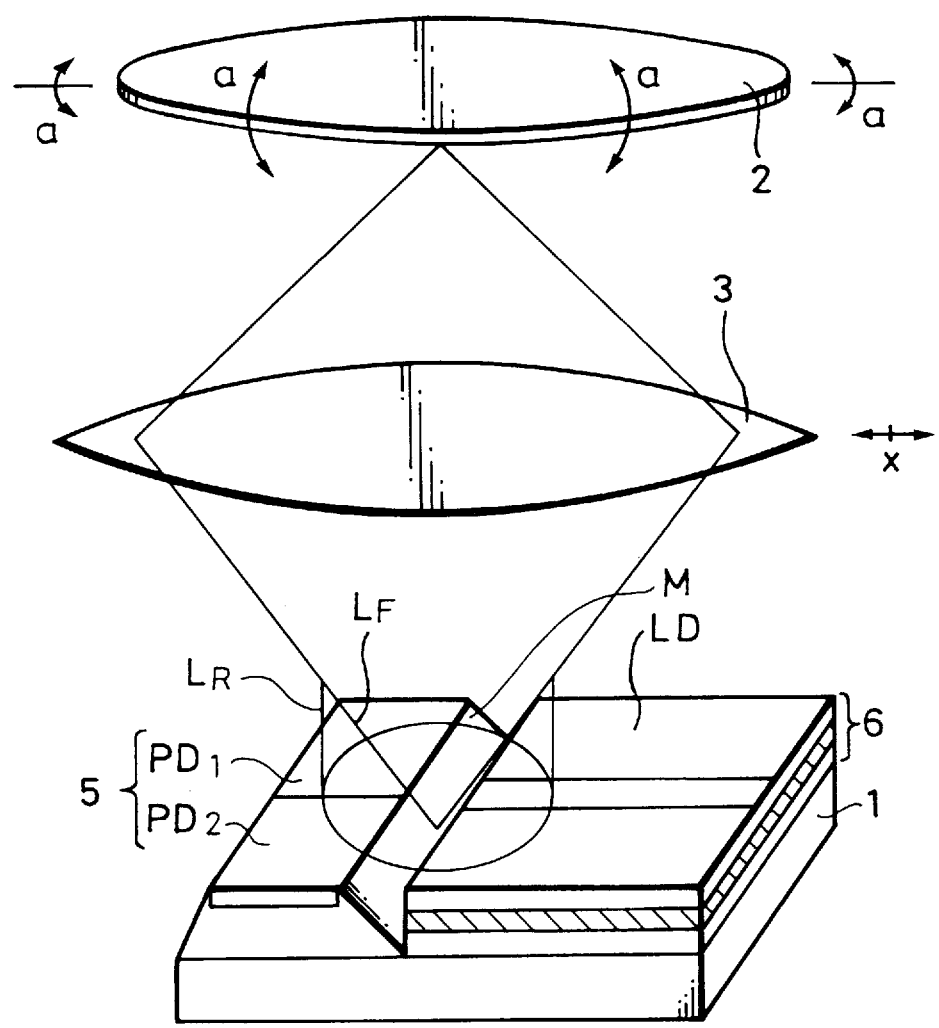
FIG. 6 is a schematic configuration (a perspective view) of an optical device to which the present invention is applied.

FIG. 6 shows the configuration of major parts of the optical device according to the present invention. AS shown in FIG. 6, in the case of the present embodiment, the present invention is applied to an optical pick-up in which a portion to be irradiated is, for example, an optical disc having a recording pit thereon and the optical disc is irradiated by a laser light to read records thereon.

An optical device 10 has a configuration including an optical element 7 comprising a light-emitting portion 4 constituted by a semiconductor laser LD having a resonator length direction in bi-direction along the surface of a semiconductor substrate 1 and a reflecting mirror M provided to one emitting end face thereof, a converging means 3 constituted by an optical component such as a lens or the like, and a light-receiving portion 5 constituted by two photodiodes PD ($PD_1$ and $PD_2$). An emitting light $L_F$ from the light-emitting portion 4 is converged by the converging means 3 to irradiate the portion 2 to be irradiated such as an optical disc or the like. A returning light LR reflected on and returned from the irradiated portion 2 is converged by the common converging means 3 to be returned to the optical element 7. The light-receiving portion 5, i.e., photodiodes $PD_1$ and $PD_2$ of the optical element 7, are disposed opposite to the region where the semiconductor laser LD is formed with the reflecting mirror M interposed therebetween in the vicinity of a confocal point with respect to the returning light $L_R$ as described above. Thus, a CLC configuration as described above is formed in which the semiconductor laser LD and the photodiodes PD are both formed in the vicinity of the confocal point of the converging means such as the lens and so on.

The returning light $L_R$ is converged by the converging means 3 to approach the limit of the optical diffraction (i.e., the limit of diffraction of the lens). The light-receiving portion 5 is arranged such that at least a part of the light-receiving surface of each of the photodiodes $PD_1$ and $PD_2$ is within the limit of optical diffraction, i.e., it is in a position at a distance of 1.22 λ/NA or less from the optical axis of the light emitted from the light-emitting portion 4 that extends across the reference plane on which the light receiving surface is provided where λ represents the wavelength of the light emitted by the light-emitting portion 4 and NA represents the numerical aperture of the converging means 3.

In this case, the diameter of the emitting light $L_F$ from the light-emitting portion 4 on the light-receiving surface of the light-receiving portion 5 is set smaller than the diameter of the limit of the optical diffraction, and the effective light-receiving surface of the light-receiving portion 5 is positioned outside the diameter of the emitting light $L_F$. If a semiconductor laser is used as the light source for the light-emitting portion 4, the diameter of the emitting light therefrom can be set in the order of 1 to 2 μm. For example, if the numerical aperture NA of the converging means 3 is in the range from 0.09 to 0.1 and the wavelength λ of the emitting light is about 780 nm, the limit of diffraction is in the order of 1.22 λ/NA≈10 μm.

In the optical device having such a configuration, the emitting light from the semiconductor laser LD is reflected by the reflecting mirror M to become the emitting light $L_F$ from the light-emitting portion 4. The emitting light $L_F$ is converged by the converging means 3, irradiated on to the optical disc at the irradiated portion 2, and reflected and diffracted by a recording pit on the optical disc at the irradiated portion 2. The diffracted light travels along a path which is coaxial with the emitting light $L_F$ before the reflection. The returning light $L_R$ from the irradiated portion 2 forms a spot having a size which is determined by the limit of diffraction and is received by the light-receiving portion 5 formed around the light-emitting portion 4. The photodiodes PD ($PD_1$ and $PD_2$) of the light-receiving portion 5 are disposed close to the semiconductor laser LD of the light-emitting portion 4, e.g., on the side of the semiconductor substrate 1 where the reflecting mirror M is located. In this case, the photodiodes $PD_1$ and $PD_2$ are formed so as to include the spot position determined by the above limit of diffraction.

Signals obtained from the photodiodes $PD_1$ and $PD_2$ when they are irradiated with the returning light $L_R$ from the irradiated portion 2 are subjected to calculations to be described later to obtain a push-pull signal.

Further, the reading of a record on the optical disc, i.e., the detection of an RF signal is performed by the two photodiodes $PD_1$ and $PD_2$ as a whole.

The optical device 10 of the present embodiment presents a much smaller offset of a tracking error signal compared to the conventional optical devices and has a greater margin for a lateral shift of the lens (indicated by x in FIG. 6) and a warp or inclination of the disc (indicated by a in FIG. 6).

A description will now be made of the signal processing performed by the optical device 10 of the present embodiment for detecting a tracking error signal.

A CPP signal (confocal push-pull signal) will be first summarized using a simplified model.

The following Equation 1 shows the complex amplitude of a zero-order diffracted light and the positive and negative first-order diffracted light, which is a complex amplitude on the plane of the confocal point based on the conventional scalar theory.

Figure 7:
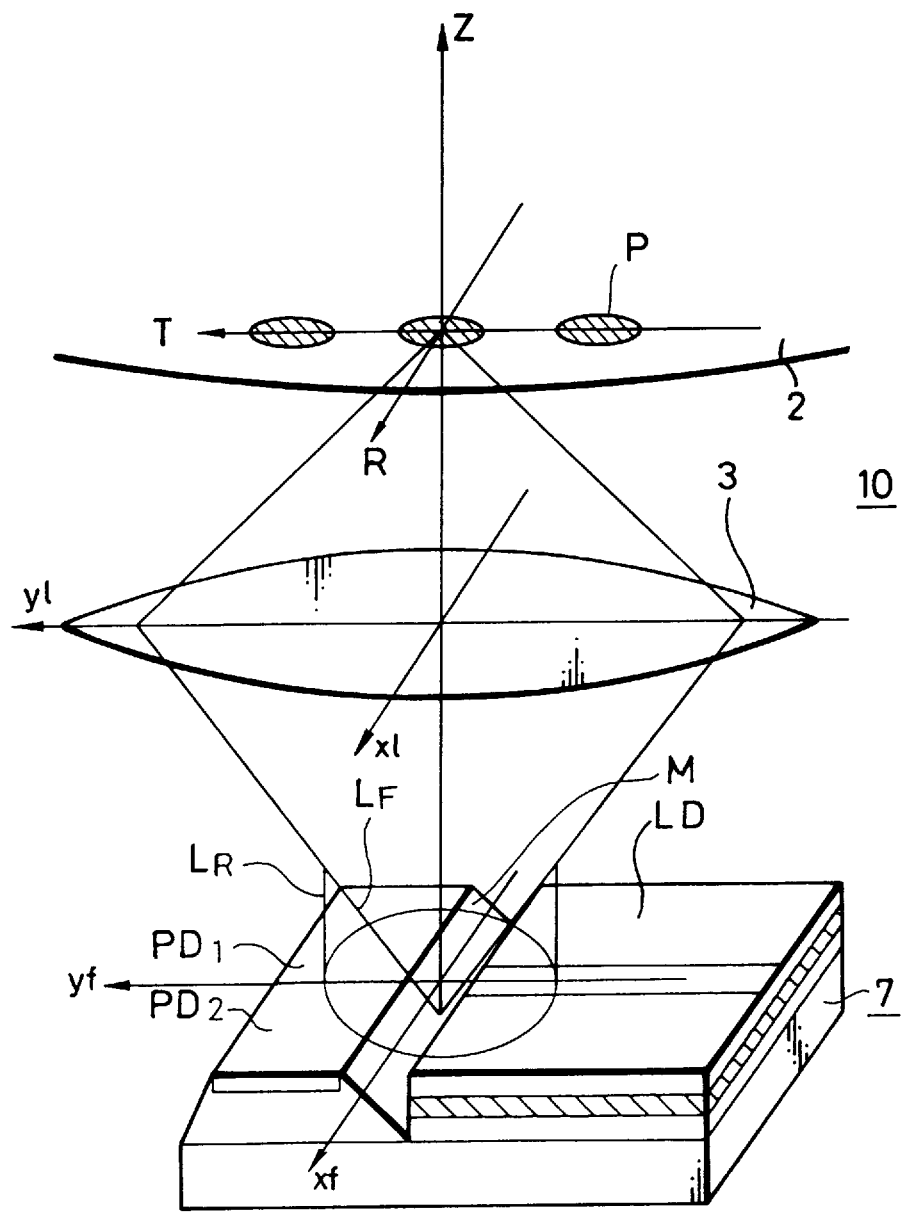
FIG. 7 is a diagram showing the coordinate axes used for calculating numerical values.

Concerning the coordinate axes used here, as shown in FIG. 7, the y-axis is the direction in which the recording medium moves (i.e., a tangential direction T along which pits P on the disc 2 are aligned); the x-axis is the recording width direction of the recording medium (i.e., the radial direction R of the disc 2), and the Z-axis is the direction of the optical axis. A coordinate xf, yf is shown on the plane of the confocal point which is substantially equal to the light-receiving surfaces of the photodiodes, and a coordinate x1, y1 is shown on the surface of the lens 3.

$$f(m, xf, yf) = \qquad\qquad\qquad\qquad\qquad\qquad \text{<Equation 1>}$$
$$C \iint F(m, x1, y1)\exp\{-ikW_{20}(x1 - d1, y1)\}\exp\{-ik\ (xfx1 +$$
$$yfy1)/f_2\}dx1dy1\, W_{20}(x, y) = df(x^2 + y^2)/2f_2^2\ F(m, x1, y1) = Am;$$
$$\{(x1 - d1)^2 + y1^2 \leq a^2\}$$
and
$$\{(x1 - xm - d1)^2 + y1^2 \leq a^2\}0;$$
other cases
$$xm = m(\lambda/\text{Pitch}) \times f_1 A0 =$$
$$C(x - 2dl, y)[1 + \text{Duty}\{\exp(2ik \times \text{Depth}) - 1\}]A + 1 =$$
$$C(x - 2dl, 2y)\text{Duty} \times$$
$$\text{sinc}(\text{Duty})\{\exp(2ik \times \text{Depth}) - 1\}\exp(-2\pi dd/\text{Pitch})A - 1 =$$
$$C(x - 2dl, y)\text{Duty} \times$$
$$\text{sinc}(-\text{Duty})\{\exp(2ik \times \text{Depth}) - 1\}\exp(-2\pi dd/\text{Pitch})Am = 0;$$
$$|m| > 1 C(x, y) = \exp[-2(\log 2)\{(x/f_2\|)^2 + (y/f_2 q\perp)^2\}]$$

where C represents a constant; λ represents a wavelength; k represents 2 π/λ; a represents the radius of the aperture of the lens; $f_1$ represents the focal length of the lens of the side of the object (on the side of the recording medium); $f_2$ represents the focal length of the lens on the side of the optical device; "Pitch" represents the interval (pitch) between grooves on the recording medium; "Depth" represents the depth of the grooves on the recording medium; "Duty" represents the ratio between the grooves and lands on the recording medium (0 to 1); "dd" represents the amount of a detrack; "df" represents the amount of defocus at the confocal point which is $df/2(f_2/f_1)^2$ on the surface of the medium; "d1" represents the amount of a lateral shift of a lens; "q∥" represents an FFP (far field pattern) in the horizontal direction; "q⊥" represents an FFP (far field pattern) in the vertical direction; F(m, x1, y1) represents the complex amplitude of light on the surface of the lens; f(m, xf, yf) represents the complex amplitude of light on the plane of the confocal point; sinc(duty)=sin(π·duty)/(π·duty); and W represents the width of the region of the photodiodes.

In order to simplify the calculation, it is assumed here that the strength distribution within the aperture of the lens is constant and that the shift of the lens is negligible (d1=0 in the Equation 1).

Further, in order to expand the equation simply and to obtain the final result in a simple form, the calculation is made on a one-dimensional basis where there are variables only in the x1 direction.

From the result of the above-mentioned numerical analysis, it is expected that a CPP signal can be expressed by a linear equation or a polynomial of the amount of defocus.

Meanwhile, in Equation 1 described above, a phase term produced by defocus is only the term of $W_{20}$ including df, i.e., exp{-ik $W_{20}$(x1-d1, y1)}. Therefore, if the behavior of the CPP signal is considered on the assumption that the amount of defocus df is actually suppressed to a value within the range of ±1 μm, the simplest approach is to perform Taylor expansion on the term including $W_{20}$ in the vicinity of the amount of defocus (df)=0 to derive an analytical solution. The amount of defocus is set within the range of ±1 μm here on the assumption that the focus servo actually works.

Specifically, as shown in the following Equation 2, Taylor expansion is performed on the term exp(-ik $W_{20}$) including $W_{20}$ in the vicinity of the amount of defocus (df)=0 to derive an approximated analytical solution. $W_{20}$=df×x1$^2$/(2$f_2^2$) on the one-dimensional basis where there is only variables in the x1 direction.

$$\exp(-ikW_{20}) = \qquad\qquad\qquad\qquad\qquad \text{<Equation 2>}$$
$$\exp\{-ik(x1^2/(2f_2^2)) \times df\} \approx 1 + \{-ik(x1^2/(2f_2^2)) \times df\} +$$
$$\{-ik(x1^2/(2f_2^2)) \times df\}^2/2 + \{-ik(x1^2/(2f_2^2)) \times df\}^3/3! + \ldots$$

It is important in the signal processing up to what order is validated in the Taylor expansion of Equation 2. The result of the calculation of the numerical values will serve as a guideline for such a purpose. Considering the fact that in the approximation of a normal polynomial, almost all of the second-order terms can be approximated, the CPP signal is assumed to be expressed by Equation 3 shown below.

$$Scpp = M0 + M1 \times (df) + M2 \times (df)^2 \qquad \text{<Equation 3>}$$

Figure 1:
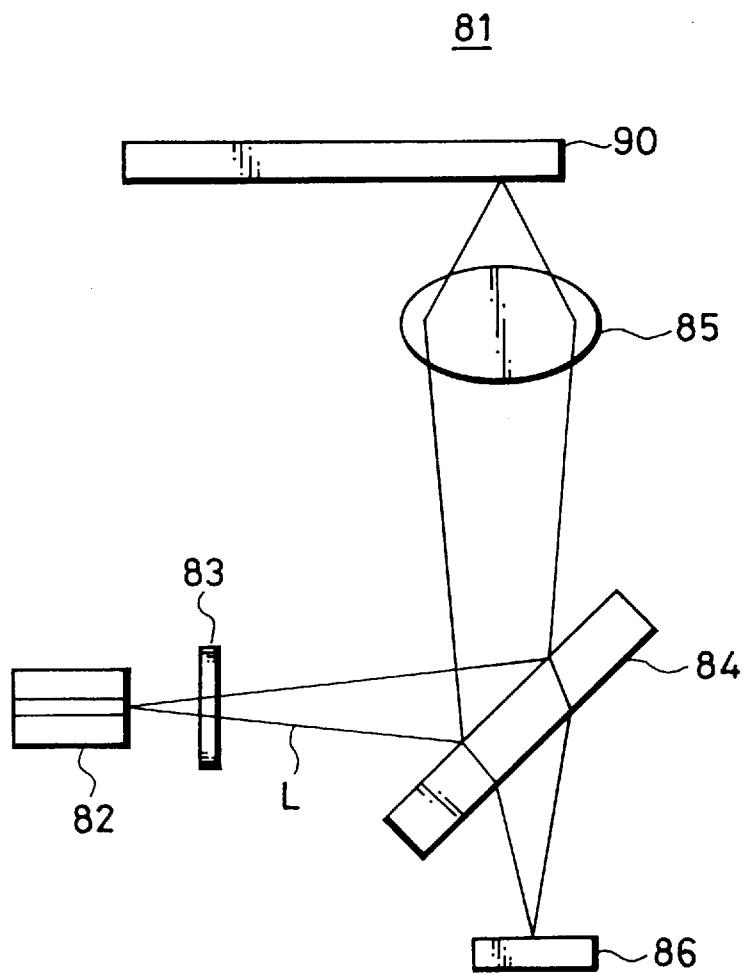
FIG. 1 illustrates a schematic configuration of a conventional optical device.
Figure 2A:
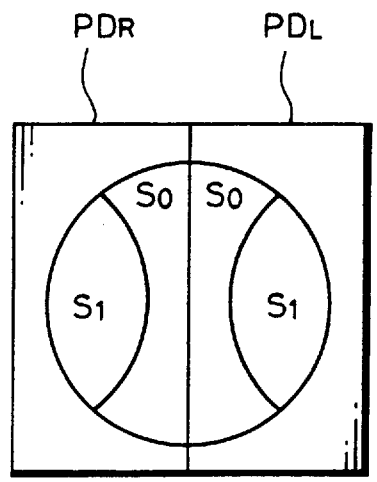
FIGS. 2A and 2B are diagrams used to explain a tracking servo achieved by the push-pull method.
Figure 2B:
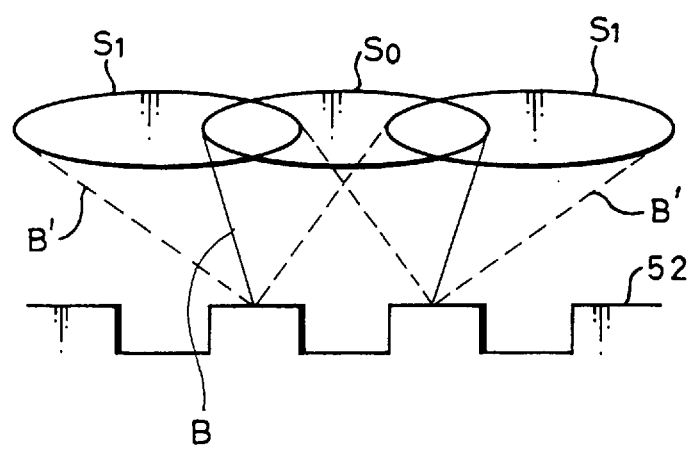
Figure 3A:
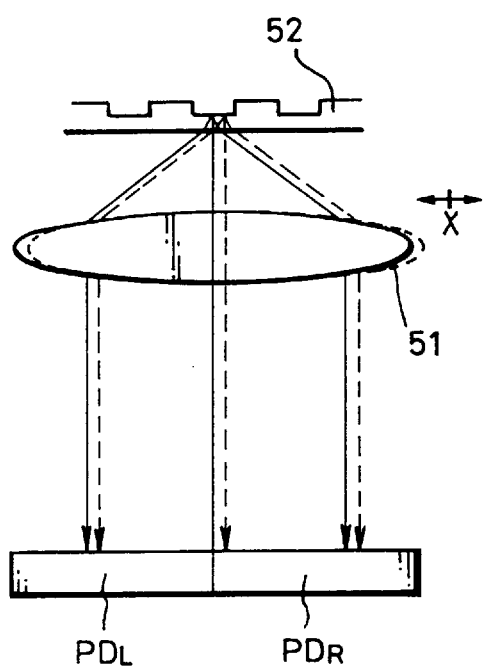
FIG. 3A is a view showing an offset caused by a shift of a lens.
Figure 3B:
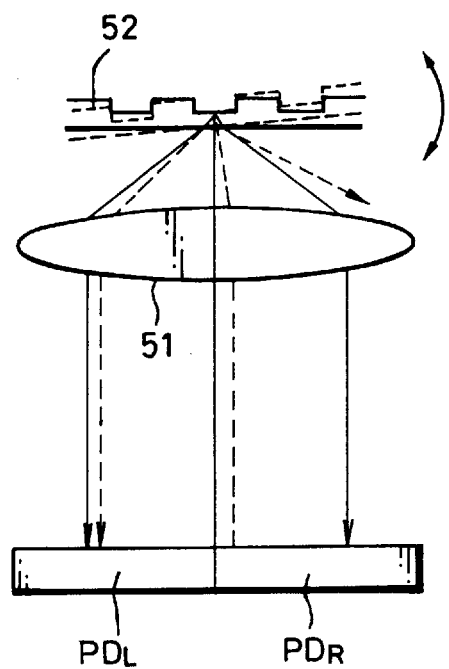
FIG. 3B is a view showing an offset caused by an inclination of a lens.
Figure 4:
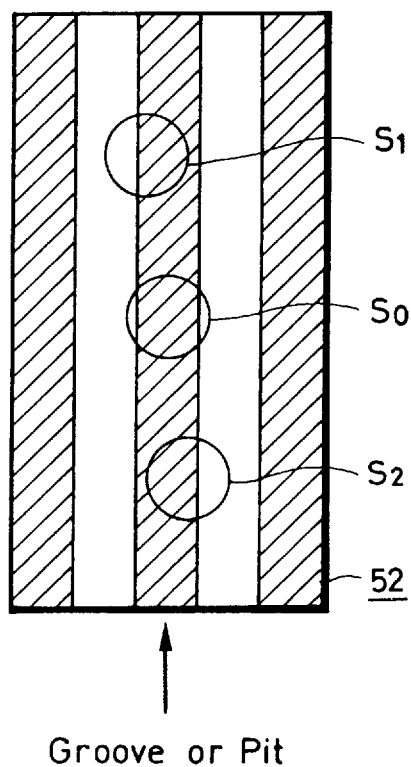
FIG. 4 is a diagram used for explaining a tracking servo achieved using the three spot method.
Figure 5:
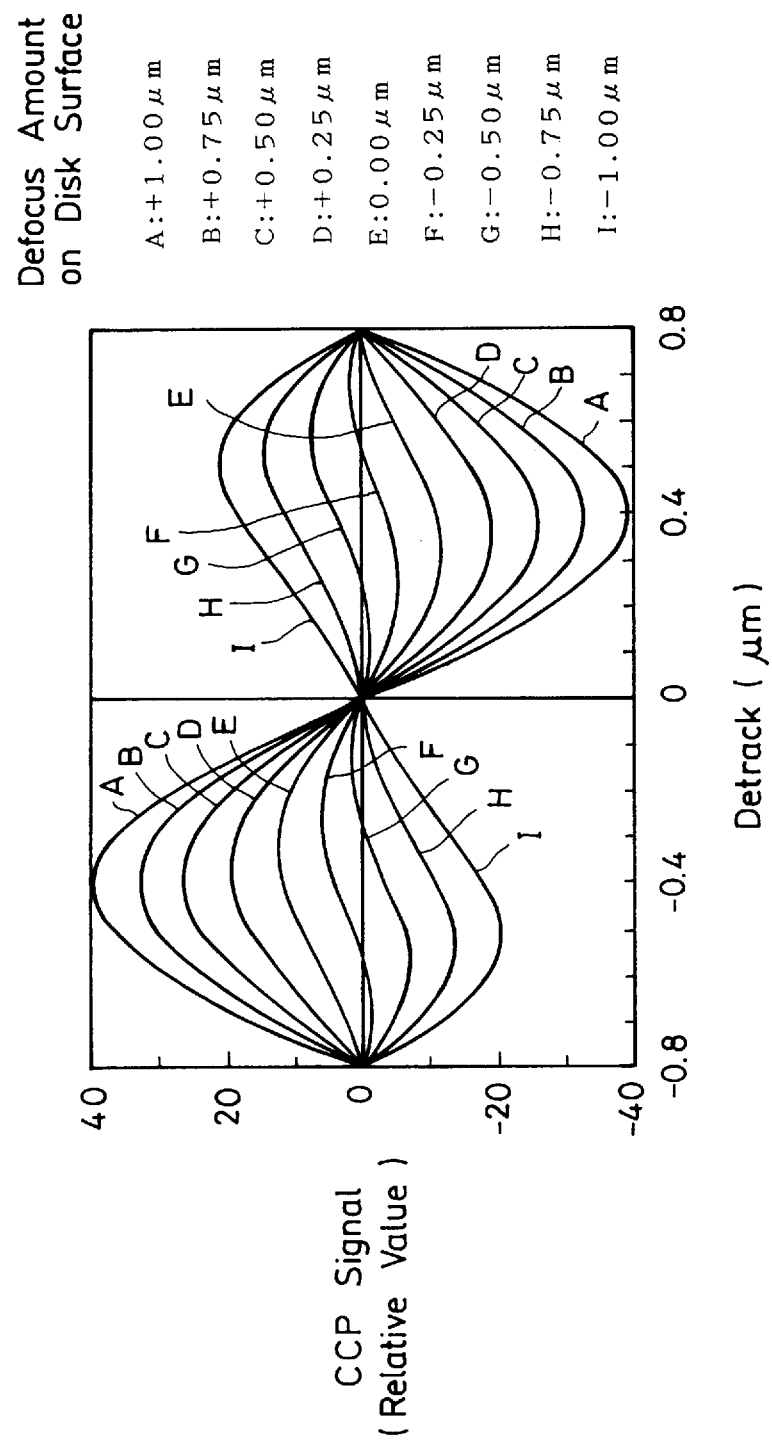
FIG. 5 is a graph showing the relationship between a tracking error signal and the amount of defocus according to the CPP method.
Figure 8:
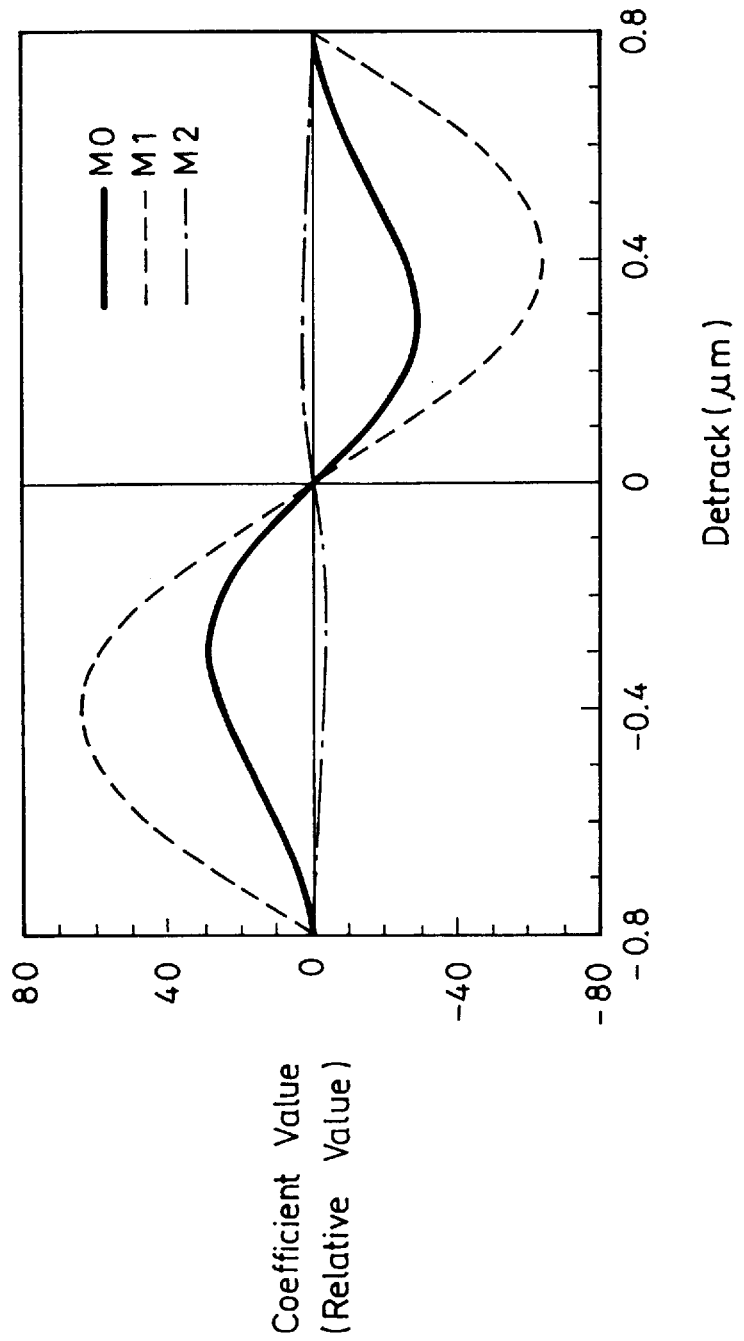
FIG. 8 is a graph showing a variation of a coefficient of a CPP signal.

FIG. 8 shows how values M0, M1 and M2 obtained from a numerical analysis on the amount of a detrack and the magnitude of the CPP signal Scpp according to Equation 3 vary in response to variation in the amount of a detrack. A disc having the same shape as that used for the calculations in FIG. 5 has been used as a model.

As apparent from the result shown in FIG. 8, the coefficient M2 of the second-order term is 10% or less of the coefficient M0 of the zero-order term and, since the amount of defocus df is smaller than about ±1 μm (df<±1 μm), the term M2×(df)$^2$ has a small value which can be substantially negligible.

In addition, as will be described later, the second-order term has a similar effect only when a tracking error is detected using the first-order coefficient M1.

Therefore, the CPP signal Scpp is expressed as a linear equation of the amount of defocus df.

Next, solutions of approximated analysis on a CPP signal was formulated according to the computational procedures described above.

The distribution of light intensity I (xf) at a coordinate x=xf on the plane of the confocal point can be expressed by Equation shown below.

$$I(xf) = \qquad\qquad\qquad\qquad\qquad\qquad \text{<Equation 4>}$$
$$(R11^2 + R12^2)\Phi 00(re)^2 + (R21^2 + R24^2)\Phi p1(re)^2 +$$
$$(R22^2 + R23^2)\Phi p1(img)^2 + 2(R11 \cdot R21 + R12 \cdot R24)\Phi 00(re)\Phi p1(re) +$$
$$2(R21 \cdot R22 - R23 \cdot R24)\Phi p1(re)\Phi p1(img) +$$
$$2(R11 \cdot R22 - R12 \cdot R23)\Phi 00(re)\Phi p1(img) + 2df \times$$
$$[(R11 \cdot R23 + R12 \cdot R22)(\Phi 00(re)\Phi p2'(re) + \Phi p1(img)\Phi 00'(img)) +$$
$$(R11 \cdot R24 - R12 \cdot R21)(\Phi 00(re)\Phi p2'(img) - \Phi p1(re)\Phi 00'(img)) +$$
$$(R21 \cdot R23 + R22 \cdot R24)(\Phi p1(re)\Phi p2'(re) + \Phi p1(img)\Phi p2'(img))]$$

The respective parameters in Equation 4 represent the contents of Equations 5 and 6 shown below.

$$R11 = (1 - \text{duty}) + \text{duty} \cdot \cos(2k\ \text{depth}) \qquad \text{<Equation 5>}$$
$$R12 = -\text{duty} \cdot \sin(2k\ \text{depth})$$
$$R21 = 2\text{duty} \cdot \text{sinc}(\text{duty}) \cdot (\cos(2k\ \text{depth}) - 1) \cdot \cos(2\pi\ \text{detrack/pitch})$$

-continued $R22 = 2\text{duty} \cdot \text{sinc}(\text{duty}) \cdot (\cos(2k \text{ depth}) - 1) \cdot \sin(2\pi \text{ detrack/pitch})$ $R23 = 2\text{duty} \cdot \text{sinc}(\text{duty}) \cdot \sin(2k \text{ depth}) \cdot \sin(2\pi \text{ detrack/pitch})$ $R24 = -2\text{duty} \cdot \text{sinc}(\text{duty}) \cdot \sin(2k \text{ depth}) \cdot \cos(2\pi \text{ detrack/pitch})$ $$\Phi 00(re) = \left(\frac{2f_2}{kxf}\right) \sin\left(\frac{ka}{f_2} xf\right) \qquad \text{<Equation 6>}$$

$$\Phi 00'(img) = \left(\frac{-f_2}{k^2 xf^3}\right) \left[ 2\left(\frac{ka}{f_2} xf\right) \cos\left(\frac{ka}{f_2} xf\right) + \left[\left(\frac{k(a-x1)}{f_2} xf\right)^2 - 2\right] \sin\left(\frac{k(a-x1)}{f_2} xf\right) \right]$$

$$\Phi p1(re) = \left(\frac{f_2}{kxf}\right) \left[ \sin\left(\frac{ka}{f_2} xf\right) + \sin\left(\frac{k(a-x1)}{f_2} xf\right) \right]$$

$$\Phi p1(img) = \left(\frac{f_2}{kxf}\right) \left[ \cos\left(\frac{ka}{f_2} xf\right) - \cos\left(\frac{k(a-x1)}{f_2} xf\right) \right]$$

$$\phi p2'(re) = \left(\frac{-f_2}{2k^2 xf^3}\right) \left[ -2\left(\frac{ka}{f_2} xf\right) \sin\left(\frac{ka}{f_2} xf\right) - 2\frac{k(a-x1)}{f_2} xf \sin\left(\frac{k(a-x1)}{f_2} xf\right) + \left[\left(\frac{ka}{f_2} xf\right)^2 - 2\right] \cos\left(\frac{ka}{f_2} xf\right) - \left[\left(\frac{k(a-x1)}{f_2} xf\right)^2 - 2\right] \cos\left(\frac{k(a-x1)}{f_2} xf\right) \right]$$

$$\phi p2'(img) = \left(\frac{-f_2}{2k^2 xf^3}\right) \left[ -2\left(\frac{ka}{f_2} xf\right) \cos\left(\frac{ka}{f_2} xf\right) - 2\frac{k(a-x1)}{f_2} xf \cos\left(\frac{k(a-x1)}{f_2} xf\right) + \left[\left(\frac{ka}{f_2} xf\right)^2 - 2\right] \sin\left(\frac{ka}{f_2} xf\right) - \left[\left(\frac{k(a-x1)}{f_2} xf\right)^2 - 2\right] \sin\left(\frac{k(a-x1)}{f_2} xf\right) \right]$$

The even function components in Equation 4 which are expressed by Equations 5 and 6 are ultimately canceled because of the symmetrical property of the separated photodiodes to be formed and because of the final form of the CPP signal Scpp ($=PD_1-PD_2$).

In the respective components, the components $\Phi 00(re)$, $\Phi 00'(img)$, $\Phi p1(re)$ and $\Phi p2'(img)$ are even functions, and components $\Phi p1(img)$ and $\Phi p2'(re)$ are odd functions. The first square term, the second term, and the second of one of the df terms of the first-order are odd functions and are therefore canceled. Further, the last term is also canceled because its coefficient $R21 \cdot R23 + R22 \cdot R24 = 0$.

Therefore, Equation 7 shown below is obtained if a strength component (odd function) on the separated photodiodes which contributes to the CPP signal is represented by Iodd(xf).

$Iodd(xf) = 2(R21 \cdot R22 - R23 \cdot R24)\Phi p1(re)\Phi p1(img) +$     <Equation 7>

$2(R11 \cdot R22 - R12 \cdot R23)\Phi 00(re)\Phi p1(img) +$ $2df \times (R11 \cdot R23 + R12 \cdot R22)(\Phi 00(re)\Phi p2'(re) + \Phi p1(img)\Phi 00'(img))$ Since the Sccp is ultimately obtained by integrating xf in each of the range of the separated photodiodes PD ($PD_1$ and $PD_2$), Equation 7 can be expanded into Equation 8 below to express the Scpp.

$Scpp =$     <Equation 8>

$$2(R11 \cdot R22 - R12 \cdot R23)\left[\int_0^w \Phi 00(re)\Phi p1(img) dxf - \int_{-w}^0 \Phi 00(re)\Phi p1(img) dxf\right] +$$

$$2(R21 \cdot R22 - R23 \cdot R24)\left[\int_0^w \Phi p1(re)\Phi p1(img) dxf - \int_{-w}^0 \Phi p1(re)\Phi p1(img) dxf\right] +$$

$2 \text{ defocus} \cdot (R11 \cdot R23 + R12 \cdot R22) \times$ $$\left[\int_0^w (\Phi 00(re)\Phi p2'(re) + \Phi p1(img)\Phi 00'(img)) dxf - \int_0^w (\Phi 00(re)\Phi p2'(re) + \Phi p1(img)\Phi 00'(img)) dxf\right] (R11 \cdot R22 - R12 \cdot R23) =$$

$2 \text{ duty} \cdot (2 \text{ duty} - 1) \cdot \text{sinc}(\text{duty}) \cdot (1 - \cos(2k \text{ depth})) \cdot$
$\sin(2\pi \text{ detrack/pitch})(R21 \cdot R22 - R23 \cdot R24) = 4 \text{ duty}^2 \cdot$ $(\text{sinc}(\text{duty}))^2 \cdot (1 - \cos(2k \text{ depth})) \cdot$ $\sin(2 \times 2\pi \text{ detrack/pitch})(R11 \cdot R23 + R12 \cdot R22) =$ $2 \text{ duty} \cdot \text{sinc}(\text{duty}) \cdot \sin(2k \text{ depth}) \cdot \sin(2\pi \text{ detrack/pitch})$ Although several possible methods of detecting a tracking error can be conceived based on the above-described result, let us consider to use only the third term of Equation 8, i.e., the first-order term of the amount of defocus df, as the simplest and most effective method.

The equation for approximating the CPP signal Scpp can be revised taking Equation 8 into consideration to obtain Equation 9 shown below.

$Scpp = M0 + M1 + df$     <Equation 9>

$M0 = C1 \times \sin(2\pi \times \text{detrack/pitch}) + C3 \times \sin(2 \times 2\pi \times \text{detrack/pitch})$ $M1 = C5 \times \sin(2k \times \text{depth}) \times \sin(2\pi \times \text{detrack/pitch})$ where C1, C2 and C3 are constants.

Attention must be paid here to the form of the coefficient M1. A signal Sp obtained based on the conventional push-pull method can be solved to obtain Equation 10 shown below based on the normal scalar theory.

$Sp = CX\sin(\phi) \times \sin(2\pi \times \text{detrack/pitch})$     <Equation 10> where φ represents the phase difference between the zero-order diffracted light and the positive and negative first-order diffracted light and C represents a constant.

Since φ is a quantity determined by the depth of the disc and is equivalent to 2 k× depth, the signal Sp is equivalent to the coefficient M1 of Equation 9.

Therefore, a CPP signal in a form similar to that in the prior art can be obtained by calculating M1=∂Sccp/∂df and by effectuating the tracking servo based on the same.

∂Sccp/∂df can be calculated by common methods such as measuring the variation in the Scpp signal while perturbing the lens in the direction of the optical axis at a constant cycle.

For an actual optical device to which the present invention is applied like the optical device 10 of the first embodiment of shown in FIG. 6, the tracking servo can be effectuated, for example, by checking the variation in a Cpp signal in response to variation in the amount of defocus from a differential signal of the CPP signal Scpp=(PD$_1$−PD$_2$) to calculate ∂Scpp/∂defocus=M1 obtained by performing partial differentiation on the CPP signal (tracking error signal) by the amount of defocus, and by correcting the CPP signal using the coefficient M1 to estimate the amount of detrack more accurately with an extremely small offset.

Referring to the means for measuring the amount of defocus, i.e., for detecting a focus error in the above-described process, any known conventional methods and various methods for detecting a focus error proposed by the applicant may be used, such as the astigmia method and spot size method and so on.

In such a manner, a tracking error can be accurately detected even if there is only a slight defocus associated with the actual focus servo.

The following improvements over a conventional CPP signal can be expected from the tracking servo utilizing the above-described tracking error signal.

(1) The method of tracking servo can be applied to various optical recording media regardless of disc structures because it involves no signal having a doubled or different frequency.

(2) Conventional servo system and conventional know-hows may be used as they are for signal processing.

(3) Although the above-described analysis was described assuming rectangular pits, methods for accommodating pits of other shapes can be contemplated based on the prior art.

(4) The method provides advantages of the confocal push-pull method such as stability against a lens shift and so on.

(5) No servo means having a higher performance than the advantages described items (1) through (4) are required.

Therefore, the detection of a tracking error signal performed by the optical device according to the present invention has advantages as shown below over the prior art.

Figure 9A:
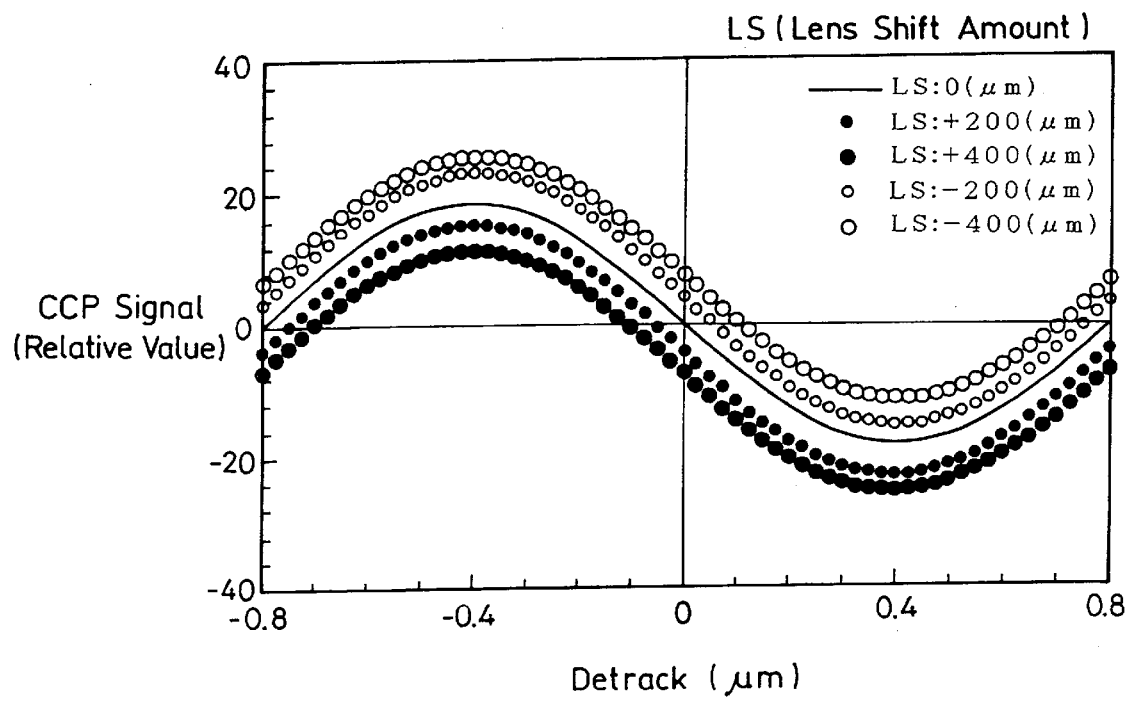
FIG. 9A is a graph showing a tracking error signal obtained by the conventional push-pull method.
Figure 9B:
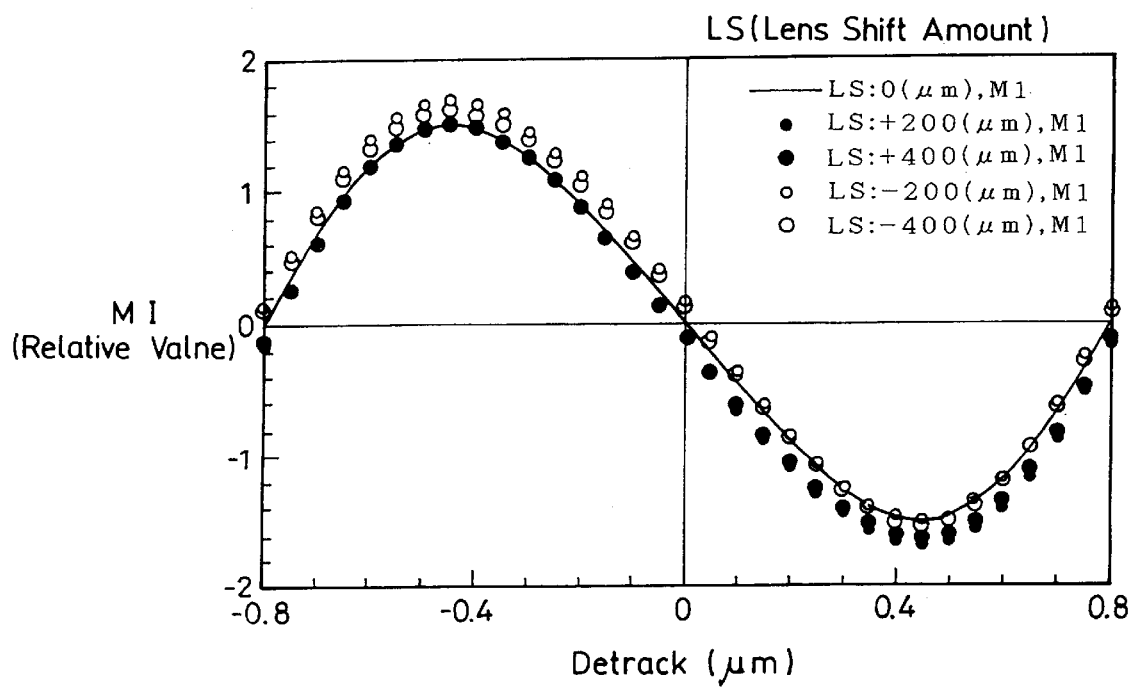
FIG. 9B is a graph showing a tracking error signal obtained by an optical device according to the present invention.

(1) It is stable against a lens shift (see FIGS. 9A and 9B).

(2) Since there are no additional optical parts required for the detection of a tracking error, a simple optical system can be configured with the number of parts reduced. This allows the assembling and adjusting steps to be simplified.

(3) Manufacturing cost is reduced through the reduction of the number of parts and the simplification of steps.

(4) Optical loss is reduced because there is no additional part to allow lower power consumption.

(5) A small size and a light weight can be achieved to provide an improved response speed.

(6) An optical recording medium can be recorded and reproduced at a higher linear velocity with power consumption maintained at substantially the same level as the prior art.

Since no lens shift is taken into consideration in formulating Equation 9, there is no direct support for an assumption that this method is stable against a lens shift like a conventional CPP signal. Then, Equation 1 was used again to estimate such stability through a numerical analysis taking a lens shift into consideration.

FIGS. 9A and 9B are graphs that compare the effect of a lens shift on a tracking error signal between the case of a conventional CPP signal and the case of a signal according to the present invention. FIG. 9A shows the conventional CPP signal, and FIG. 9B shows the signal according to the present invention. The ordinate axes in those graphs both represent relative values. The disc used here is a model having the same shape as that used for the calculations shown in FIG. 5.

In the case of the present invention shown in FIG. 9B, variation of the coefficient M1 (∂Scpp/∂defocus) is plotted along the ordinate axis.

FIGS. 9A and 9B show that with the conventional CPP signal, a tracking error signal is shifted as a whole in response to a lens shift while the amount of such a shift is suppressed according to the present invention especially when the amount of detrack is a small value around 0 to allow accurate adjustment of tracking.

The above-described embodiment may be applied to an optical device for performing reading and writing of the record on an optical recording medium such as an optical disc, a phase-changing optical disc, a magneto-optical disc or the like.

As the focus servo means and the means for detecting the RF signals and the like of the optical device according to the present invention, known means in the prior art or the means and methods already proposed by the applicant may be used, and an optical device may be configured to include such means.

The optical device according to the present invention detects a tracking error signal using coefficients obtained by performing partial differentiation on a push-pull signal detected in the vicinity of a confocal point with the amount of defocus to eliminate variation in the tracking error signal due to the defocus, thereby performing accurate tracking servo.

Further, it is possible to significantly reduce an offset in a tracking error signal due to a lens shift.

Since there are no additional optical parts required for the detection of a tracking error signal, a simple optical system can be configured with the number of parts reduced. This allows the assembling and adjusting steps to be simplified.

This allows an optical device to be manufactured at a lower cost and reduces loss of the amount of light, thereby reducing power consumption.

The present invention makes it possible to provide a more compact and lighter optical device with an improved response speed.

Therefore, the present invention allows an optical recording medium to be recorded and reproduced at a higher linear velocity with power consumption maintained at substantially the same level as the prior art.

Having described a preferred embodiment of the present invention with reference to the accompanying drawings, it is to be understood that the invention is not limited to the precise embodiment and that various changes and modifications could be effected therein by one skilled in the art without departing from the spirit or scope of the invention as defined in the appended claims.

What is claimed is:

1. An optical device comprising:

a light-emitting portion for emitting a laser light;

a converging means for converging the laser light emitted from said light-emitting portion; and a light-receiving portion for receiving the laser light emitted from said light-emitting portion; wherein said converging means converges the light emitted from said light-emitting portion to thereby irradiate a portion to be irradiated and converges a light reflected on and returned from said irradiated portion;

said light-receiving portion is located in the vicinity of a confocal point of said converging means with respect to the light returned from said irradiated portion; and the light emitted from said light-emitting portion is received by said light-receiving portion along a path which is coaxial before and after being reflected on said irradiated portion; and wherein a push-pull signal is detected by said light-receiving portion; and said push-pull signal is subjected to partial differentiation with an amount of defocus to obtain a coefficient which is used to detect a tracking error signal.

2. The optical device according to claim 1, wherein said light-emitting portion comprises a horizontal resonator type laser and a reflecting portion disposed in a face-to-face relationship to one of emitting end faces of said laser, and said light-receiving portion is formed on said reflecting portion.

3. The optical device according to claim 1, wherein said light-emitting portion and said light-receiving portion are formed on a same substrate.

4. An optical device comprising:

a semiconductor laser for emitting a laser light;

a reflecting portion for reflecting said laser light;

a lens for reflecting the laser light emitted from said light-emitting portion; and a light-receiving portion separated into two parts for receiving the laser light emitted from said light-emitting portion; wherein said lens converges the light emitted from said semiconductor laser to thereby irradiate a portion to be irradiated and further converges a light reflected on and returned from said irradiated portion;

said light-receiving portion is located in the vicinity of a confocal point of said lens with respect to the light returned from said irradiated portion; and the light emitted from said semiconductor laser is received by said light-receiving portion along a path which is coaxial before and after being reflected on said irradiated portion; and wherein a push-pull signal is detected by said light-receiving portion; and said push-pull signal is operated with an amount of a focus error to obtain a coefficient which is used to detect a tracking error signal.

5. The optical device according to claim 4, wherein said semiconductor laser is a horizontal resonator type laser and said light-receiving portion is formed on said reflecting portion disposed in a face-to-face relationship to one of emitting end faces of said laser.

6. The optical device according to claim 4, wherein said semiconductor laser and said light-receiving portion are formed on a same substrate.

* * * * *